United States Patent
Ross

(10) Patent No.: US 6,965,270 B1
(45) Date of Patent: Nov. 15, 2005

(54) REGULATED CASCODE AMPLIFIER WITH CONTROLLED SATURATION

(75) Inventor: James P. Ross, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 86 days.

(21) Appl. No.: 10/741,969

(22) Filed: Dec. 18, 2003

(51) Int. Cl.[7] .............................................. H03F 3/04
(52) U.S. Cl. ........................ 330/311; 330/291; 330/296
(58) Field of Search ........................ 330/311, 291, 296

(56) References Cited

U.S. PATENT DOCUMENTS

| | | | |
|---|---|---|---|
| 5,451,909 A | | 9/1995 | Fattaruso |
| 5,892,356 A | | 4/1999 | Chuang |
| 5,923,217 A | * | 7/1999 | Durec ........................ 330/288 |
| 6,377,120 B1 | * | 4/2002 | Hsieh ......................... 330/253 |
| 2004/0008086 A1 | * | 1/2004 | Sanchez et al. ............. 330/260 |

OTHER PUBLICATIONS

Eduard Sackinger et al.; "A High-Swing, High-Impedance MOS Cascode Circuit"; 1990 IEEE; IEEE Journal of Solid-State Circuits, vol. 25, No. 1; Feb. 1990; pp. 289-298.
Bahram Zand et al.; "Transimpedance Amplifier with Differential Photodiode Current Sensing"; 1999 IEEE; pp. II-624 through II-627.
Yonghua Cong et al.; "Cascode Current Mirrors with Low Input, Output and Supply Voltage Requirements"; Four pages.
T. Loeliger et al.; "Cascode Circuits for Low-Voltage and Low-Current Applications"; Four pages.
Teddy Loeliger et al.; "Cascode Circuits for Switched Current Copiers"; four pages.
Edgar Sanchez-Sinencio; "Low Voltage Analog Circuit Design Techniques: A Tutorial"; IEEE Dallas CAS Workshop 2000; available from http://amsc.tamu.edu/; 78 pages.

* cited by examiner

*Primary Examiner*—Patricia Nguyen
(74) *Attorney, Agent, or Firm*—Arthur Joseph Behiel

(57) ABSTRACT

Described are regulated cascode amplifiers with improved low-voltage performance. The improved amplifier is similar to conventional regulated cascode amplifiers, including a cascode circuit and a feedback amplifier. The cascode circuit conventionally includes two output transistors, the first of which preferably remains in saturation to provide a relatively stable output resistance over a range of output voltages. A booster circuit in accordance with one embodiment maintains the first transistor of the cascode circuit in saturation over a broader range of output voltages, and consequently extends the low-end of the operating range of the cascode amplifier.

22 Claims, 5 Drawing Sheets

REGULATED CASCODE AMPLIFIER WITH CONTROLLED SATURATION

BACKGROUND

FIG. 1 (prior art) depicts a regulated cascode (RGC) amplifier 100, which has a relatively high output impedance $r_0$ and a wide output voltage swing. RGC 100 includes a feedback amplifier 105, a bias voltage terminal $V_{BIAS}$, a cascode circuit 110, an input terminal $V_{IN}$, and an output terminal $V_{OUT}$. Feedback amplifier a 105 includes a first current sourcing transistor 120 and amplifier transistor 125 connected in series between first and second power supply terminals $V_{DD}$ and $V_{SS}$. Cascode circuit 110 includes input and output transistors 130 and 135 connected in series between output terminal $V_{OUT}$ and supply terminal $V_{SS}$.

In operation, input transistor 130 converts input voltage $V_{IN}$ into a drain current $I_0$ that flows through the drain-source path of output transistor 135 to output terminal $V_{OUT}$. The drain-source voltage across transistor 130 should be relatively stable to suppress channel-length modulation that might otherwise reduce output impedance $r_0$. The drain-source voltage of transistor 130 is therefore regulated about a fixed value by a feedback loop that includes amplifier transistor 125 and output transistor 135. Feedback amplifier 105 stabilizes the drain-source voltage of transistor 135 even when transistor 135 is biased in the linear region, which extends the usable range of the output signal $V_{OUT}$.

FIG. 2 (prior art) depicts an improved regulated cascode amplifier (IRGC) 200. IRGC 200 is similar to a regulated cascode circuit 100 of FIG. 1, similar components having the same label and function. In addition to feedback amplifier circuit 105 and cascode circuit 110, IRGC 200 includes a level shifter 205. Level shifter 205 in turn includes a diode-connected transistor 210 and a second current-sourcing transistor 215 connected in series between supply terminal $V_{DD}$ and the drain of transistor 130. The gate and drain of transistor 215 connect to bias voltage terminal $V_{BIAS}$ and the drain of transistor 210, respectively. The gate and drain of transistor 210 connect to the gate of transistor 125, while the source connects to the drain of transistor 130.

The inclusion of level shifter 205 provides improved performance for low-voltage applications. Level shifter 205 limits the drain-source voltage $V_{DS130}$ of transistor 130 to the difference between the gate-source voltage $V_{GS125}$ of transistor 125 and the gate-source voltage $V_{GS210}$ of transistor 210 (i.e., $V_{DS130}=V_{GS125}-V_{GS210}$). This relatively low voltage at the drain of transistor 130 reduces the minimum level for output voltage $V_{OUT}$.

The performance of IRGC 200 depends to a large extent on the characteristics of feedback amplifier 105, which in turn depends on the transconductance $g_M$ of transistor 125. A high $g_M$, obtained by increasing the width W of transistor 125, improves the response time of feedback amplifier 105, a desirable characteristic for high-speed circuits. Increasing the width also reduces the gate-source voltage $V_{GS125}$ of transistor 125, and consequently the drain-source voltage $V_{DS130}$ across transistor 130. The relationship between the width of transistor 125 and the drain-source voltage $V_{DS130}$ of transistor 130 sets an upper limit on the width of transistor 125: if the width of transistor 125 is too high, the drain-source voltage $V_{DS130}$ of transistor 130 can be reduced to levels that bring transistor 130 into the linear range. This is undesirable, as the output resistance $r_0$ of IRGC 200 varies considerably with output voltage $V_{OUT}$ when transistor 130 operates in the linear region. Unfortunately, the constraints on the width of transistor 125 limit the speed performance of IRCC 200 in low-voltage applications.

SUMMARY

The present invention is directed to a regulated cascode amplifier with improved low-voltage performance. The improved amplifier is similar to conventional regulated cascode amplifiers, including a cascode circuit and a feedback amplifier. The cascode circuit conventionally includes two output transistors, the first of which preferably remains in saturation to provide a relatively stable output resistance over a range of output voltages. A booster circuit in accordance with one embodiment maintains the first transistor of the cascode circuit in saturation over a broader range of output voltages, and consequently extends the low-end of the operating range of the cascode amplifier.

This summary does not limit the invention, which is instead defined by the claims.

DETAILED DESCRIPTION

Figure 2:
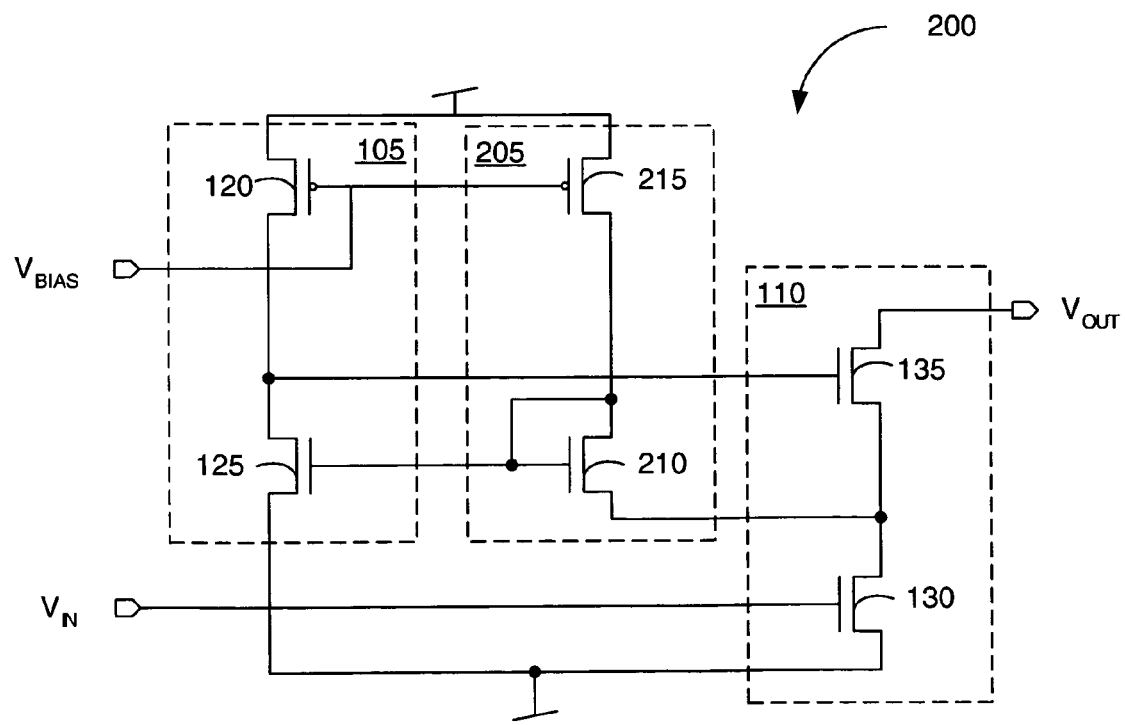
FIG. 2 (prior art) depicts an improved regulated cascode amplifier having a level-shifter.
Figure 3A:
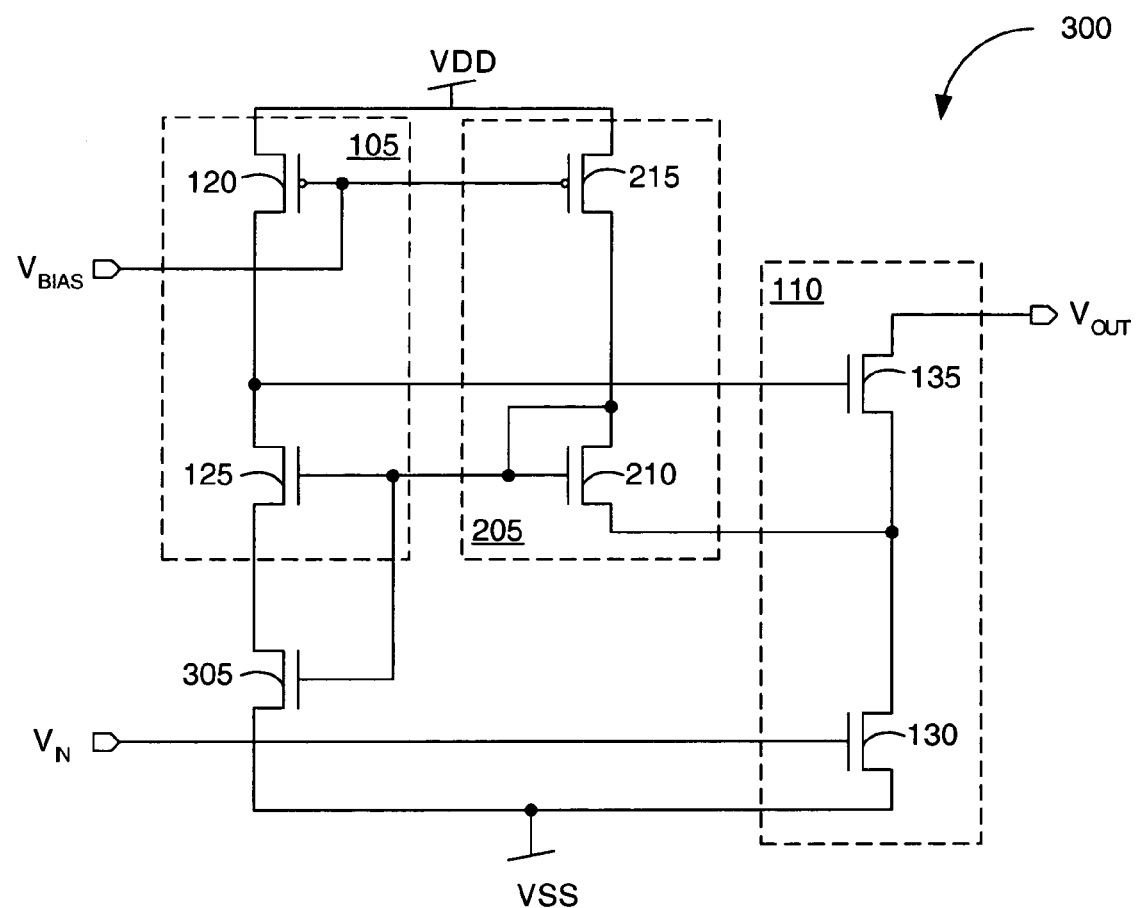
FIG. 3A depicts an embodiment of a boosted regulated cascode amplifier.

FIG. 3A depicts an amplifier 300 in accordance with one embodiment of the present invention. Amplifier 300 is similar to improved regulated cascode amplifier 200 of FIG. 2, similar components having the same label and function. Amplifier 300 is modified, however, to reduce the constraints on transistor 125 and consequently to increase output impedance $r_0$ and speed performance in low-voltage applications. Though amplifiers 300 and 200 are similar, various design parameters, such as transistor aspect ratios (W/L), will vary as necessary to adapt amplifiers 300 and 200 to particular applications, as will be understood by those of skill in the art.

In common with amplifier 200 of FIG. 2, amplifier 300 includes feedback amplifier 105, cascode circuit 110, and level shifter 205. Amplifier 300 additionally includes a booster transistor 305 connected between feedback amplifier 105 and ground potential GND. The drain and gate of booster transistor 305 connect to the source (feedback-amplifier terminal) and gate (feedback-amplifier bias terminal) of amplifier transistor 125, respectively.

Applying Kirchoff's Voltage Law (KVL) to a voltage loop formed by transistors 305, 125, 210, and 130 elucidates the significance of booster transistor 305. Starting at the source of input transistor 130 and traversing the voltage loop counterclockwise, the loop KVL equation is:

$$V_{DS130}+V_{TH210}+\Delta V_{210}-V_{TH125}-\Delta V_{125}-V_{DS305}=0 \quad (1)$$

where $V_{DS130}$ is the drain-source voltage of input transistor 130; $V_{DS305}$ is the drain-source voltage of booster transistor 305 and is equal to a booster voltage $V_{BT}$; $V_{TH125}$ is the threshold voltage of amplifier transistor 125; $\Delta V_{125}$ is an excess voltage across amplifier transistor 125 necessary for transistor 125 to sink current sourced by transistor 120; $V_{TH210}$ is the threshold voltage of diode-connected transistor 210, and $\Delta V_{210}$ is an excess voltage across transistor 210 necessary for transistor 210 to sink current sourced by transistor 215.

Substituting booster voltage $V_{BT}$ for drain-source voltage $V_{DS305}$ of transistor 305 and making drain-source voltage $V_{DS130}$ of input transistor 130 the subject of equation 1, equation 1 then can be simplified to:

$$V_{DS130} = V_{BT} + \Delta V_{125} + V_{TH125} - V_{TH210} - \Delta V_{210} \quad (2)$$

Assuming that the threshold voltages $V_{TH125}$ and $V_{TH210}$ and the excess voltages $\Delta V_{210}$ and $\Delta V_{125}$ of respective transistors 125 and 210 are equal simplifies Equation 2 to:

$$V_{DS130} = V_{BT} \quad (3)$$

Equation 3 is the basis of designing amplifier 300 to reduce or eliminate the limitations of amplifier 200 of FIG. 2. From equation 3, it can be seen that booster circuit 305 can be used to set a minimum voltage on the drain of input transistor 130. Setting booster voltage $V_{BT}$ equal to the saturation voltage $V_{DSsat130}$ of input transistor 130 prevents transistor 130 from drifting out of the saturation mode.

In one embodiment, transistors 125 and 210 are matched to reduce equation 2 to equation 3. The components of booster transistor 305 can also be selected so that when amplifier 300 is biased as depicted in FIG. 3A, booster voltage $V_{BT}$ generally coincides with saturation voltage $V_{DSsat130}$.

Figure 3B:
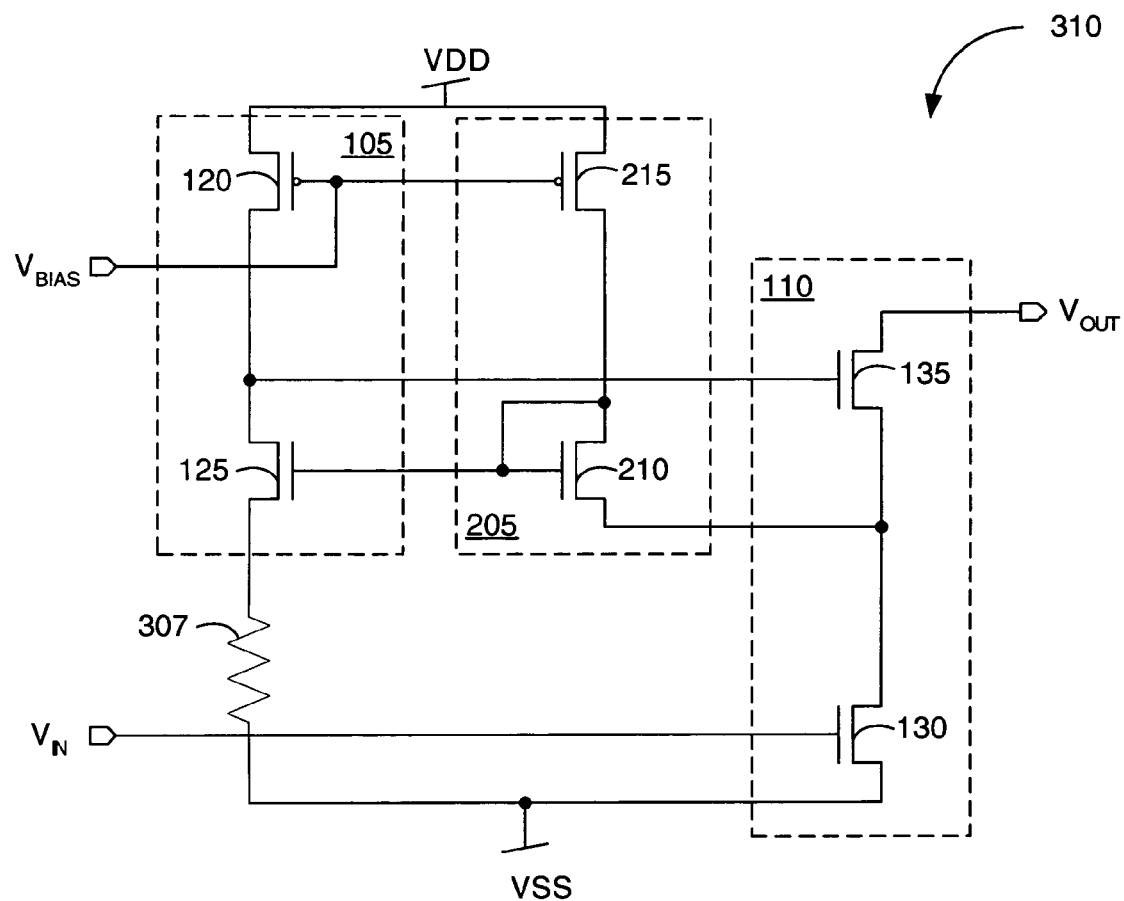
FIG. 3B depicts another embodiment of a boosted regulated cascode amplifier.

FIG. 3B depicts an amplifier 310 in accordance with another embodiment of the present invention. Amplifier 310 is similar to amplifier of FIG. 3B and the same elements are labeled with the same numbers. In amplifier 310 booster circuit 305 is replaced by a resistor 307 connected between the source of transistor 125 and the second supply terminal $V_{SS}$. Resistor 307, i.e., a bias circuit, provides the bias voltage (i.e., booster voltage $V_{BT}$) for current source transistor 130 to maintain transistor 130 in saturation mode. The bias current for transistor 130 is provided by the current mirror transistor 215 to transistor 120. The effect of process variation on the resistor 307 may be compensated for by making the bias current a function of the type of resistor. At least one advantage of having resistor 307 is that the size restrictions on transistors 125 and 210 are relaxed compared to the amplifier circuit without resistor 307.

Figure 4:
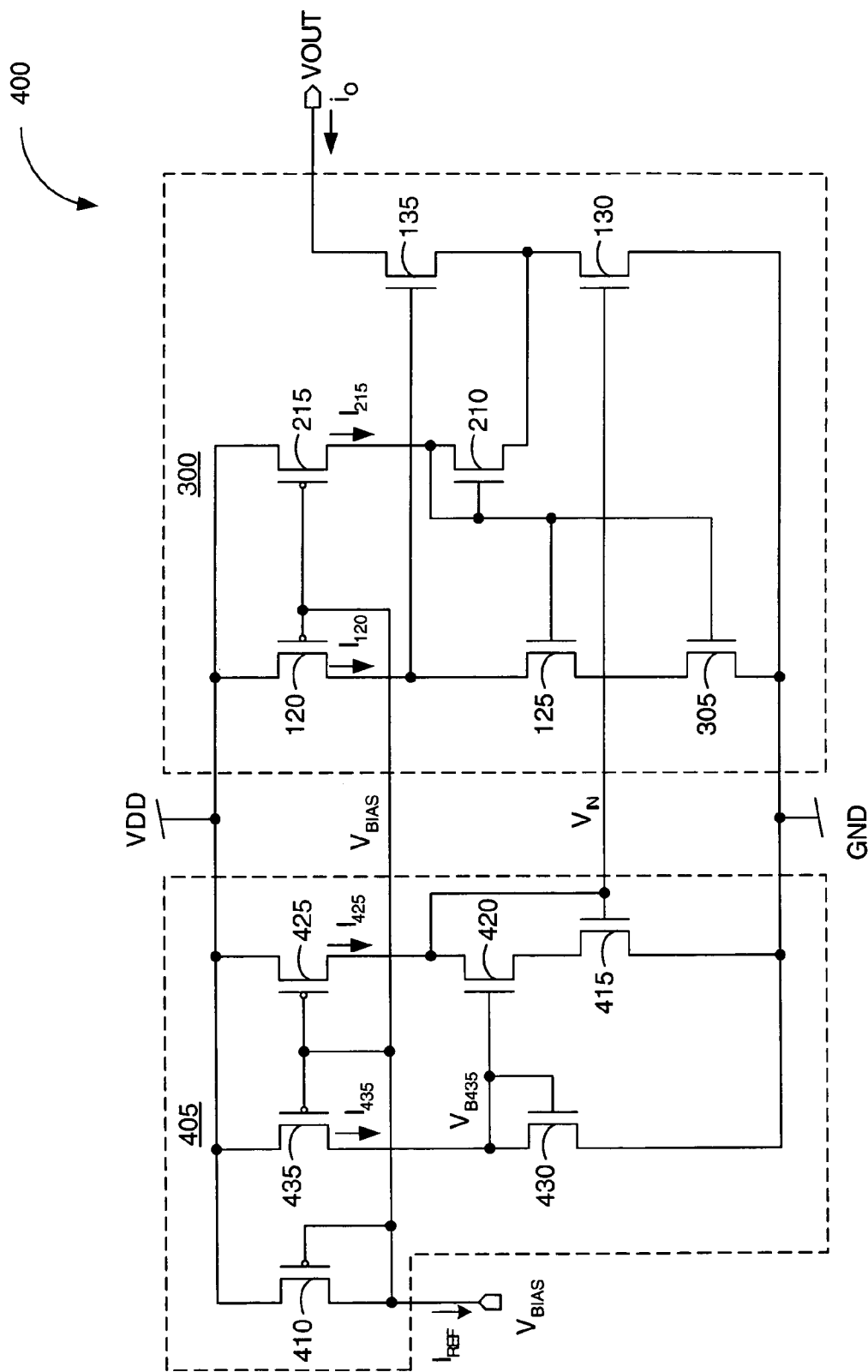
FIG. 4 depicts an embodiment of a current mirror 400 that employs boosted regulated cascode amplifier of FIG. 3A.

FIG. 4 depicts a current mirror 400 that includes an embodiment of amplifier 300 of FIG. 3A (or of amplifier 310 of FIG. 3B) and a bias circuit 405. Multiplier 400 additionally includes a reference terminal connected to a bias terminal $V_{BIAS}$ of amplifier 300. The reference terminal receives a reference current $I_{REF}$ and generates a bias voltage $V_{BIAS}$. Bias circuit 405 includes a reference transistor 410 connected between power supply terminal $V_{DD}$ and a bias terminal $V_{BIAS}$, and a series of transistors 415, 420, and 425 connected between supply terminals VDD and GND. Bias circuit 405 additionally includes a pair of transistors 430 and 435 connected between power supply terminals $V_{DD}$ and GND.

During operation, bias voltage $V_{BIAS}$ biases diode-connected transistor 410 to source a reference current $I_{REF}$, which is then mirrored by mirror transistors 435, 425, 120, and 215. The resulting currents $I_{435}$, $I_{425}$, $I_{120}$, and $I_{215}$ are proportional to reference current $I_{REF}$. As is conventional in current multiplier circuits, the proportionality of a mirrored current to the reference current is determined by the ratio of the aspect ratios of the mirror and reference transistors, so the value of each of currents $I_{435}$, $I_{425}$, $I_{120}$, and $I_{215}$ depends on the aspect ratio of respective transistors 435, 425, 120 and 210.

Current $I_{435}$ establishes a first bias voltage $V_{B435}$ on the drain and gate of diode-connected transistor 430 and the gate of transistor 420. Diode-connected transistor 430 ensures that voltage $V_{B435}$ never falls below the sum of the threshold and excess voltages of transistor 430 (i.e., $V_{th430} + \Delta V_{430}$) above ground potential GND to keep transistors 420 biased on. Similarly, current $I_{425}$ establishes a second bias voltage $V_{IN}$ at the drain of transistor 420, the gate of transistor 415, and the input terminal $V_{IN}$ of amplifier 300. To provide the best match between reference current $I_{REF}$ and output current $i_O$, the drain-source voltage $V_{DS415}$ of transistor 415 should match the drain-source voltage $V_{DS130}$ of input transistor 130. Transistor 420 is therefore included to more closely match the drain-source voltages of transistors 415 and 130.

Figure 1:
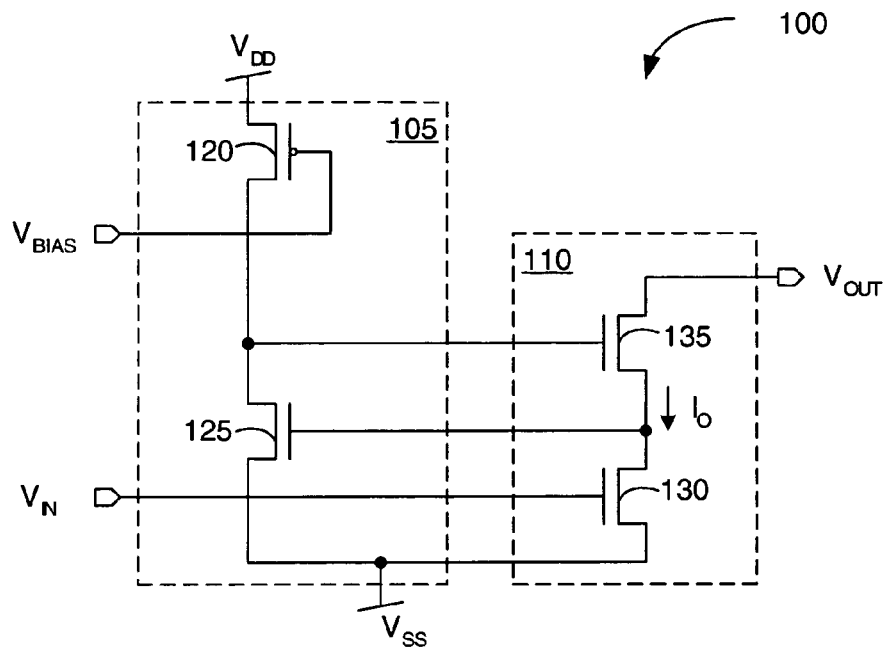
FIG. 1 (prior art) depicts a simple regulated cascode amplifier.

Recalling from the discussion of regulated cascode 100 of FIG. 1, input transistor 130 converts input voltage $V_{IN}$ into an output current $i_O$. It is important to maintain input voltage $V_{IN}$ at a fixed value to bias input transistor 130 to sink a constant output current $i_O$. Input voltage $V_{IN}$ is therefore stabilized by biasing all the transistors of bias circuit 405 in the saturation mode and employing a positive feedback mechanism to regulate input voltage VIN. Transistors 420 and 415 provide the positive feedback by sinking more current $I_{425}$ when input voltage $V_{IN}$ increases and limiting current $I_{425}$ when input voltage $V_{IN}$ decreases. When voltage $V_{IN}$ increases, the drain-source voltage of transistors 420 and 425 likewise increase. However, because transistor 420 is already in saturation, the increase in drain-source voltage has little effect on the current through transistor 420. On the other hand, increased gate-source voltage strongly affects transistor 415 by decreasing its drain voltage. Transistor 420 transmits the reduction in the drain voltage of transistor 415 to terminal $V_{IN}$, which counteracts the increase in input voltage $V_{IN}$. A reduction of input voltage $V_{IN}$ triggers the opposite response. Thus by tightly regulating input voltage $V_{IN}$ about a fixed value and taking advantage of the superior characteristics of amplifier 300, current multiplier 400 generates an output current $i_O$ that is generally a precise multiple of reference current $I_{REF}$.

Table 1 below shows some typical sizes of some transistors of current multiplier 400 in one embodiment.

TABLE 1

| TRANSISTOR | 410 | 425 | 415 | 210 | 130 |
|---|---|---|---|---|---|
| WIDTH (W) | 11.27 | 112.7 | 23.996 | 311.948 | 240.240 |
| LENGTH (L) | 0.805 | 0.805 | 0.28 | 0.28 | 0.126 |
| $I_{REF}$ MULTIPLIER | 1 | 100 | 100 | 1300 | 1300 |

One embodiment of current multiplier 400 sized as shown in Table 1 provides an output current approximately 1300 times the reference current.

Figure 5:
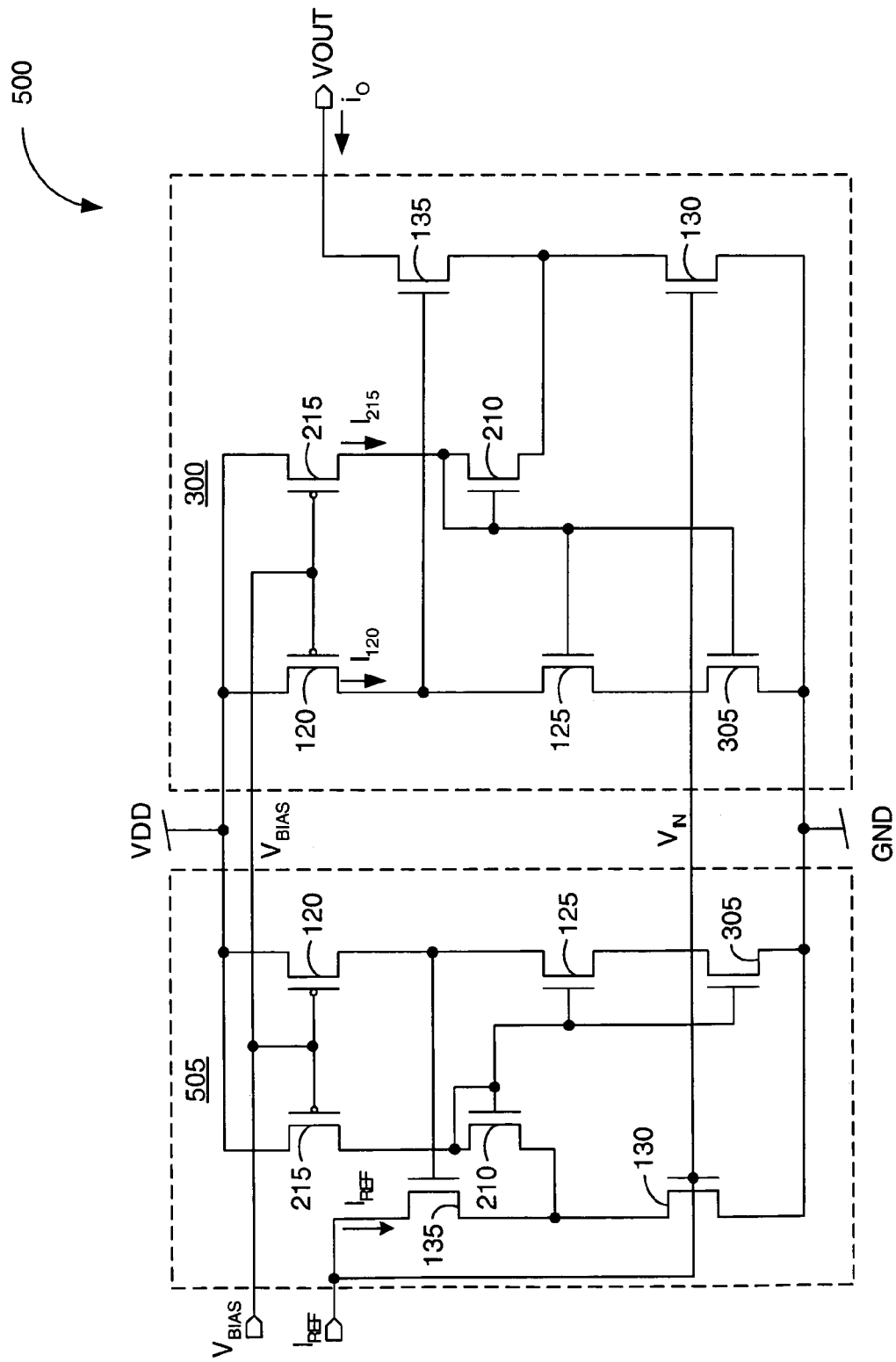
FIG. 5 depicts a current mirror 500 in accordance with another embodiment.

FIG. 5 depicts a current mirror 500 in accordance with another embodiment. Like current mirror 400 of FIG. 4, current mirror 500 includes an embodiment of amplifier 300 of FIG. 3A. In place of bias circuit 405, however, current mirror 500 includes a bias circuit 505. Bias circuit 505 is a mirror image of amplifier 300, like-numbered elements being the same or similar. An external reference current Iref is driven into the node of bias circuit 505 that is analogous to the output node $V_{OUT}$ of amplifier 300. The similarity between bias circuit 505 and amplifier 300 is advantageous because both circuits will track closely in response to process, voltage, and temperature variations. In other embodiments, the transistors in amplifier 300 are sized differently than corresponding transistors in bias circuit 505 to produce a current multiplier.

While the present invention has been described in connection with specific embodiments, variations of these embodiments will be obvious to those of ordinary skill in the art. For example, in embodiments such as those depicted in FIGS. 4 and 5 a single bias circuit can provide biasing voltages for a number of amplifiers 300 to produce a plurality of similar or different output currents. Therefore, the spirit and scope of the appended claims should not be limited to the foregoing description.

What is claimed is:

1. An amplifier connected between first and second power supply terminals, the amplifier comprising:
 a. an amplifier input terminal;
 b. an amplifier output terminal;
 c. a feedback amplifier having
   i. a bias terminal receiving a first bias voltage;
   ii. first and second feedback terminals; and
   iii. a feedback-amplifier terminal;
 d. a cascode circuit including:
   i. an input transistor having a first current-carrying terminal connected to the first feedback terminal, a second current-carrying terminal connected to the second supply terminal, and a control terminal connected to the amplifier input terminal; and
   ii. a output transistor having a first current-carrying terminal connected to the amplifier output terminal, a second current-carrying terminal connected to the first feedback terminal, and a control terminal connected to the second feedback terminal; and
 e. a booster circuit connected between the feedback-amplifier terminal and the second power supply terminal, the booster circuit configured to generate a booster voltage on the feedback-amplifier terminal sufficient to bias the input transistor in a saturation mode.

2. The amplifier of claim 1, wherein the booster circuit comprises a booster transistor having a first current-carrying terminal connected to the second power-supply terminal, a second current-carrying terminal, and a gate connected to the first feedback terminal.

3. The amplifier of claim 2, wherein a minimum voltage of the first feedback terminal is substantially equivalent to the booster voltage.

4. The amplifier of claim 1, wherein the feedback amplifier provides a negative feedback to the cascode circuit in response to a voltage change on the amplifier output terminal.

5. The amplifier of claim 4, wherein the feedback amplifier provides the negative feedback to the cascode circuit via the second feedback terminal.

6. The amplifier of claim 1, wherein the booster circuit includes a booster transistor having a first current carrying terminal connected to the feedback-amplifier terminal, a second current-carrying terminal connected to the second power supply terminal, and a control terminal, wherein the booster transistor is biased to operate in a triode mode.

7. The amplifier of claim 6, wherein the feedback amplifier transmits a booster voltage on the feedback-amplifier terminal to the first current-carrying terminal of the input transistor.

8. The amplifier of claim 6, wherein the booster voltage is substantially equivalent to the saturation voltage of the input transistor.

9. The amplifier of claim 6, wherein the feedback amplifier further includes a feedback-amplifier bias terminal connected to the control terminal of the booster transistor.

10. The amplifier of claim 1, further comprising a level-shifter connected between the first feedback terminal and the booster circuit.

11. The amplifier of claim 1, wherein the feedback amplifier includes:
 a. an amplifier transistor having a first current-carrying terminal connected to the second feedback terminal, a second current-carrying terminal connected to the feedback-amplifier terminal, and a control terminal;
 b. a first current sourcing transistor having a first current-carrying terminal connected to the first power supply terminal, a second current-carrying terminal connected to the second feedback terminal, and a control terminal connected to the bias terminal;
 c. a diode-connected transistor having first current-carrying and control terminals connected together, and a second current-carrying terminal connected to the first feedback terminal; and
 d. a second current-sourcing transistor having a first current-carrying terminal connected to the first power supply terminal, a second current-carrying terminal connected to the first current-carrying terminal of the diode-connected transistor, and a control terminal connected to the bias terminal.

12. The amplifier of claim 11, wherein the amplifier input terminal receives a constant bias voltage and the input transistor converts the constant bias voltage into an output current.

13. The amplifier of claim 11, wherein the amplifier employs negative feedback to maintain a relatively constant output voltage.

14. The amplifier of claim 1, wherein the amplifier is a current mirror.

15. The amplifier of claim 1, wherein the amplifier is a voltage amplifier.

16. The amplifier of claim 1, wherein the booster circuit includes a resistor.

17. A circuit comprising:
 a. a bias terminal;
 b. an input terminal;
 c. an output terminal;
 d. a first transistor having a first current-carrying terminal, a second current-carrying terminal, and a control terminal;
 e. a second transistor having a first current-carrying terminal connected to a first power supply terminal, a second current-carrying terminal connected to the first current-carrying terminal of the first transistor, and a control terminal connected to the bias terminal;
 f. a third transistor having a first current-carrying terminal, a second current-carrying terminal, a control terminal connected to the control terminal of the first transistor;
 g. a fourth transistor having a first current-carrying terminal connected to the first power supply terminal, a second current-carrying terminal connected to the first current-carrying terminal of the third transistor and the control terminal of the first transistor, and a control terminal connected to the control terminal of the second transistor;

h. a fifth transistor having a first current-carrying terminal connected to the output terminal, a second current-carrying terminal connected to the second current-carrying terminal of the third transistor, and a control terminal connected to the first current-carrying terminal of the first transistor;

i. a sixth transistor having a first current-carrying terminal connected to the second current-carrying terminal of the fifth transistor, a second current-carrying terminal connected to a second power supply terminal, and control terminal connected to the input terminal; and j. a bias circuit having a voltage at the second current-carrying terminal of the first transistor which is sufficient to bias the sixth transistor in a saturation mode.

18. The circuit of claim 17, wherein the bias circuit is a seventh transistor or a resistor, wherein the seventh transistor comprises a first current-carrying terminal connected to the second current-terminal of the first transistor, a second current-current-carrying transistor connected to the second power supply terminal and a control terminal connected to the control terminal of the first transistor.

19. The circuit of claim 17, wherein the circuit is a current multiplier converting the input voltage into an output current and providing the output current on the output terminal.

20. The circuit of claim 17, wherein the circuit is a voltage amplifier.

21. A circuit connected between first and second power supply terminals, the circuit comprising:

a. an amplifier input terminal;
b. an amplifier output terminal;
c. a feedback amplifier having:
   i. a bias terminal receiving a first bias voltage;
   ii. first and second feedback terminals; and
   iii. first and second feedback-amplifier terminals;
d. a cascode circuit including:
   i. an input transistor having a first current-carrying terminal connected to the first feedback terminal, a second current-carrying terminal connected to the second power supply terminal, and a control terminal connected to the amplifier input terminal; and
   ii. a output circuit having a first current-carrying terminal connected to the amplifier output terminal, a second current-carrying terminal connected to the first feedback terminal, and a control terminal connected to the second feedback terminal; and
e. a voltage boosting means connected between the first and second feedback-amplifier terminals and the second power supply terminal, the voltage boosting means providing and maintaining a saturation voltage across the input transistor.

22. The circuit of claim 21, wherein the voltage boosting means comprises a booster transistor having a first current-carrying terminal connected to the first feed-amplifier terminal, a second current-carrying terminal connected to the second power supply terminal, and a control terminal connected to the second feedback-amplifier terminal.

* * * * *